United States Patent
Kaigawa et al.

(10) Patent No.: US 8,282,854 B2
(45) Date of Patent: Oct. 9, 2012

(54) (LI, NA, K)(NB, TA, SB)O$_3$ BASED PIEZOELECTRIC MATERIAL AND MANUFACTURING METHOD THEREOF

(75) Inventors: Kazuyuki Kaigawa, Kitanagoya (JP); Hirofumi Yamaguchi, Komaki (JP)

(73) Assignee: NGK Insulators, Ltd., Nagoya (JP)

( * ) Notice: Subject to any disclaimer, the term of this patent is extended or adjusted under 35 U.S.C. 154(b) by 547 days.

(21) Appl. No.: 12/343,689

(22) Filed: Dec. 24, 2008

(65) Prior Publication Data

US 2009/0212254 A1   Aug. 27, 2009

(30) Foreign Application Priority Data

Jan. 8, 2008 (JP) ................................. 2008-001115
Nov. 12, 2008 (JP) ................................. 2008-289468

(51) Int. Cl.
*C09B 35/00* (2006.01)
*H01L 41/16* (2006.01)

(52) U.S. Cl. .................................. 252/62.9 R; 501/134

(58) Field of Classification Search .................. 501/134; 252/62.9 R

See application file for complete search history.

(56) References Cited

U.S. PATENT DOCUMENTS

| | | | |
|---|---|---|---|
| 5,505,865 A | 4/1996 | Kumar et al. | |
| 7,893,601 B2 * | 2/2011 | Kaigawa et al. | 310/358 |
| 2006/0006360 A1 | 1/2006 | Takao et al. | |
| 2006/0091588 A1 | 5/2006 | Nakamura et al. | |
| 2008/0152581 A1 * | 6/2008 | Kaigawa et al. | 423/594.8 |

FOREIGN PATENT DOCUMENTS

| | | |
|---|---|---|
| EP | 0 959 056 A1 | 11/1999 |
| EP | 1 939 951 A1 | 7/2008 |
| JP | 2005-281013 | 10/2005 |
| JP | 2006-028001 | 2/2006 |
| JP | 2007-204336 | 8/2007 |

OTHER PUBLICATIONS

U.S. Appl. No. 12/495,830, filed Jul. 1, 2009, Kaigawa et al.
U.S. Appl. No. 12/267,717, filed Nov. 10, 2008, Kaigawa et al.
Hollenstein, Evelyn, et al., *Piezoelectric Properties of Li- and Ta-modified $(K_{0.5}Na_{0.5})NbO_3$ Ceramics*, Applied Physics Letters, vol. 87, 182905 (2005).
Matsubara, Masato, et al., *Effect of Li Substitution on the Piezoelectric Properties of Potassium Sodium Niobate Ceramics*, Japanese Journal of Applied Physics, vol. 44, No. 8, 2005, pp. 6136-6142.
Guo, Yiping, et al., *Phase transitional behavior and piezoelectric properties of $(Na_{0.5}K_{0.5})NbO_3$-$LiNbO_3$ ceramics*, Applied Physics Letters vol. 85, No. 18, Nov. 1, 2004, pp. 4121-4123.
Saito, Yasuyoshi, et al., *Lead-free Piezoceramics*, Letters to Nature, 432 (2004) pp. 84-87.

\* cited by examiner

*Primary Examiner* — Carol M Koslow
(74) *Attorney, Agent, or Firm* — Burr & Brown

(57) ABSTRACT

A (Li, Na, K)(Nb, Ta, Sb)O$_3$ based piezoelectric material is a sintered body having a surface microstructure that comprises microscopic grains having a grain diameter of less than 5 μm, intermediate grains having a grain diameter of 5 μm or more and less than 15 μm, and coarse grains having a grain diameter of 15 μm or more and 50 μm or less. The amount of coarse grains is 3% or more in a share of grains in terms of area. The piezoelectric material can be manufactured by mixing metal-containing compounds so as to give the above-mentioned formulation, calcining the mixture and then crushing the resultant to obtain a calcined/crushed powder, then keeping temperature constantly at a temperature within a range from 800 to 950° C. for a predetermined period of time in a constant temperature keeping process, and raising temperature to firing temperature for sintering.

11 Claims, 2 Drawing Sheets

EXAMPLE 3
(USING A KEEPING STEP OF 880°C × 3h.)

(LI, NA, K)(NB, TA, SB)O₃ BASED PIEZOELECTRIC MATERIAL AND MANUFACTURING METHOD THEREOF

FIELD OF THE INVENTION

The present invention relates to (Li, Na, K) (Nb, Ta, Sb) $O_3$ based piezoelectric materials used for actuators or sensors and manufacturing methods thereof.

BACKGROUND OF THE INVENTION

A piezoelectric/electrostrictive actuator has an advantage that displacement can precisely be controlled in the order of submicrons. Especially, in the piezoelectric/electrostrictive actuator in which a sintered body of a piezoelectric/electrostrictive porcelain composition is used as a piezoelectric/electrostrictive body, in addition to the advantage that the displacement can precisely be controlled, there are other advantages that the actuator has high electromechanical change efficiency, large generative force, high responsivity, high durability and small power consumption, and the actuator using these advantages is employed in a head of an ink jet printer, an injector of a diesel engine or the like.

As the piezoelectric/electrostrictive porcelain composition for the piezoelectric/electrostrictive actuator, heretofore, a Pb(Zr, Ti)$O_3$(PZT) based piezoelectric/electrostrictive porcelain composition has been used, but there has been a strong fear of an influence of solute of lead from the sintered body on global environments, and hence an (Li, Na, K) (Nb, Ta)$O_3$ based piezoelectric/electrostrictive porcelain composition has been investigated.

An (Li, Na, K) (Nb, Ta)$O_3$ based piezoelectric material is usually sintered in the air or an oxygen atmosphere at 1020 to 1250° C. for 0.15 to 4 hours (e.g., Non-Patent Documents 1 to 3). A heating rate to reach a firing temperature is 200° C./h or 300° C./h, and the temperature rises at a constant heating rate from room temperature to the firing temperature (e.g., Patent Document 1).

There is also a research example in which the temperature is kept in a range of 600 to 650° C. for 1 to 5 hours in the heating process, whereby an organic binder added to improve formability of powder is removed (a de-binder process) (e.g., Patent Document 1). Microstructure of the sintered body includes grains of around 10 μm (e.g., Non-Patent Document 1). Moreover, there is a study example aimed at orientation structure of the sintered body (e.g., Non-Patent Document 4).

[Non-Patent Document 1] M. Matsubara et al., Japanese Journal of Applied Physics 44 (2005) pp. 6136-6142.
[Non-Patent Document 2] E. Hollenstein et al., Applied Physics Letters 87 (2005) 182905
[Non-Patent Document 3] Y. Guo et al., Applied Physics Letters 85 (2004) 4121
[Patent Document 1] JP-A-2006-028001
[Non-Patent Document 4] Y. Saito et al., Nature 432, 84-87 (2004)

Conventionally, study has been conducted aiming at a microstructure or orientation structure having small and uniform grain diameter for the purpose of improving electrical properties. However, for example, electric-field-induced strain S4000 is insufficient at 400 to 550 ppm, and it is desired to develop a piezoelectric material which is higher in electrical properties such as electric-field-induced strain.

SUMMARY OF THE INVENTION

The present invention aims at providing (Li, Na, K) (Nb, Ta, Sb)$O_3$ based piezoelectric materials in which electrical properties are further improved and manufacturing methods thereof.

The inventors of the present invention found out that, in a sintering schedule, by keeping a calcined/crushed powder at a predetermined temperature of 800 to 950° C. for a predetermined period of time in a heating process, then by raising the temperature to a firing temperature for sintering, there can be obtained a (Li, Na, K) (Nb, Ta, Sb)$O_3$ based piezoelectric material improved in electrical properties, where a sintered body has a surface microstructure of microscopic grains having a grain diameter of less than 5 μm, intermediate grains having a grain diameter of 5 μm or more and less than 15 μm, and coarse grains having a grain diameter of 15 μm or more and 50 μm or less, where the amount of the coarse grains is 3% or more in a share of grains in terms of area. That is, according to the present invention, the following (Li, Na, K) (Nb, Ta, Sb)$O_3$ based piezoelectric material is provided.

According to a first aspect of the present invention, a (Li, Na, K)(Nb, Ta, Sb)$O_3$ based piezoelectric material is provided, comprising a sintered body having surface microstructure including microscopic grains having a grain diameter of less than 5 μm, intermediate grains having a grain diameter of 5 μm or more and less than 15 μm, and coarse grains having a grain diameter of 15 μm or more and 50 μm or less, where the amount of the coarse grains is 3% or more in a share of grains in terms of area.

According to a second aspect of the present invention, the (Li, Na, K)(Nb, Ta, Sb)$O_3$ based piezoelectric material according to the first aspect is provided, comprising 30 to 60% of the microscopic grains in a share of grains in terms of area.

According to a third aspect of the present invention, the (Li, Na, K)(Nb, Ta, Sb)$O_3$ based piezoelectric material according to the first or second aspects is provided, expressed by a composition formula: $\{Li_y(Na_{1-x}K_x)_{1-y}\}_a(Nb_{1-z-w}Ta_zSb_w)O_3$ (here, $1 \leq a \leq 1.05$, $0.3 \leq x \leq 0.7$, $0.02 \leq z \leq 0.5$, and $0.01 \leq w \leq 0.1$).

According to a fourth aspect of the present invention, the (Li, Na, K)(Nb, Ta, Sb)$O_3$ based piezoelectric material according to any of the first to third aspects is provided, further containing at least one metal element selected from the group consisting of Mn, Cr, Fe, Co, Ni, Cu, and Zn.

According to a fifth aspect of the present invention, a manufacturing method of a (Li, Na, K) Ta, Sb)$O_3$ based piezoelectric material is provided, wherein chemical compounds having metal elements are mixed so as to have a composition expressed by (Li, Na, K)(Nb, Ta, Sb)$O_3$, the mixture is calcined and crushed to obtain a calcined/crushed powder, then, in a constant temperature keeping process, a temperature is kept constantly at a predetermined temperature within a range from 800 to 950° C. for a predetermined period of time in a heating process of a sintering schedule, and then temperature is raised to firing temperature for sintering.

According to a sixth aspect of the present invention, the manufacturing method of a (Li, Na, K) (Nb, Ta, Sb)$O_3$ based piezoelectric material according to the fifth aspect is provided, wherein in the constant temperature keeping process the temperature is kept for a predetermined period of time within a range from 0.5 to 20 hours.

According to a seventh aspect of the present invention, the manufacturing method of a (Li, Na, K) (Nb, Ta, Sb)$O_3$ based piezoelectric material according to the fifth or sixth aspects is provided, wherein the calcined/crushed powder is sintered after an additive containing at least one metal element selected from the group consisting of Mn, Cr, Fe, Co, Ni, Cu, and Zn is added to the powder.

Manufacturing (Li, Na, K) (Nb, Ta) $O_3$ based piezoelectric materials containing microscopic grains having a grain diameter of less than 5 μm, intermediate grains having a grain diameter of 5 μm or more and less than 15 μm, and coarse grains having a grain diameter of 15 μm or more and 50 μm or less, wherein the amount of the coarse grains is 3% or more in a share of grains in terms of area, enables to obtain a piezoelectric material having superior electrical properties such as electric-field-induced strain, compared with the conventional ones.

After the material expressed by (Li, Na, K) (Nb, Ta, Sb) O₃ is calcined and crushed, in the constant temperature keeping process in a heating process of a sintering schedule, temperature is kept constantly at a predetermined temperature within a range from 800 to 950° C. for a predetermined period of time, and thereafter temperature is raised to the firing temperature to carry out sintering so that the above-mentioned piezoelectric material containing microscopic grains, intermediate grains, and coarse grains is manufactured and as a result, a piezoelectric material having superior electrical properties such as electric-field-induced strain can be manufactured.

DETAILED DESCRIPTION OF THE INVENTION

Figure 1:
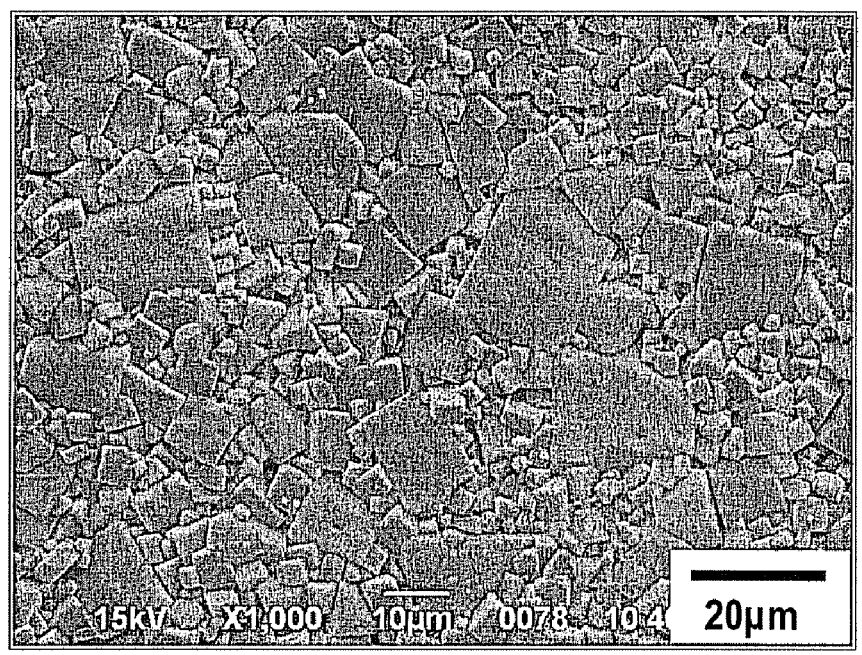
FIG. 1 is an SEM photograph showing surface microstructure of Example 3.

Hereinafter, embodiments of the present invention will be explained. The present invention is not limited to the following embodiments, and modifications, variations, and improvement can be carried out within the scope of the present invention.

The (Li, Na, K) (Nb, Ta, Sb) O₃ based piezoelectric material of the present invention has a sintered body having surface microstructure that include microscopic grains having a grain diameter of less than 5 μm, intermediate grains having a grain diameter of 5 μm or more and less than 15 μm, and coarse grains having a grain diameter of 15 μm or more and 50 μm or less, where the amount of the coarse grains is 3% or more in a share of grains in terms of area. Here, the grain diameter means a diameter corresponding to the diameter of a circle having an area equal to the area of the individual grain when the surface of the sintered body is observed by an SEM or the like. Specifically, it is preferable to include 30 to 60% of microscopic grains in the share of grains in terms of area. Here, the term "share in terms of area" means percents of grains belonging to the respective groups classified in the diameter as mentioned above, based on the total of the area of all grains; said area being calculated by using the diameter determined as mentioned above, and the share being calculated as a percent(s) using the sum of the area of grains belonging to the respective groups in the total area of all grains measured.

Conventional (Li, Na, K) (Nb, Ta, Sb)O₃ based piezoelectric materials contained coarse grains having diameters of 15 μm or more and 50 μm or less in an amount of 2% or less. By increasing the amount of such coarse grains to an amount of 3% or more as in the present invention, remarkable improvements in electrical properties can be achieved. No method for manufacturing a piezoelectric material containing coarse grains in an amount of 3% or more is not known yet; and such a piezoelectric material can be obtained, as described later, by inserting a constant temperature keeping process of keeping a to-be-sintered material in a predetermined temperature range for a given period of time and then sintering the material at a higher temperature. That is, by inserting such a constant temperature keeping process in a heating process of a sintering schedule, a (Li, Na, K) (Nb, Ta, Sb)O₃ based piezoelectric material containing coarse grains in an amount of 3% or more, which has been unobtainable heretofore, can be manufactured. This piezoelectric material is remarkably improved in electrical properties although the ratio of coarse grains seems just slightly increased as compared with the level in conventional piezoelectric materials.

Moreover, the (Li, Na, K) (Nb, Ta, Sb) O₃ based piezoelectric material of the present invention has a perovskite structure in which A site includes at least one kind of ion selected from the group consisting of Li, Na, and K, while B site includes at least one kind of ion selected from the group consisting of Nb, Ta, and Sb.

More specifically, the (Li, Na, K) (Nb, Ta, Sb) O₃ based piezoelectric material of the present invention can be expressed by the following composition formula.

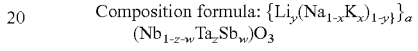

Composition formula: $\{Li_y(Na_{1-x}K_x)_{1-y}\}_a$
$(Nb_{1-z-w}Ta_zSb_w)O_3$ (here, $1 \leq a \leq 1.05$, $0.3 \leq x \leq 0.7$, $0.02 \leq y \leq 0.1$, $0 \leq z \leq 0.5$, and $0.01 \leq w \leq 0.1$.)

Here, with regard to an A/B ratio (=a), $a \leq 1.05$ is set. This is because when this range is exceeded, a dielectric loss increases, and the electric-field-induced strain under application of a high electric field tends to decrease. The increase of the dielectric loss raises a large problem in a piezoelectric/electrostrictive porcelain composition for an actuator to which the high electric field is applied. On the other hand, $1 \leq a$ is set to promote the grain growth and densify the material. When the ratio is below this range, heating at 1100° C. or more is required to promote the grain growth. In this case, evaporation of alkali components easily occurs, the composition fluctuates, and thus the properties become unstable.

With regard to the Sb substitution amount, $0.01 \leq w \leq 0.1$ is set. This is because, in this range, the electric-field-induced strain under application of a high electric field, can be made high without considerably changing the tetragonal-orthorhombic phase transition temperature (hereinafter referred to simply as "phase transition temperature") $T_{OT}$ at which piezoelectric/electrostrictive properties become high. Particularly, in the case the Sb substitution amount is defined as $0.01 \leq w \leq 0.05$, the electric-field-induced strain under application of a high electric field can be made vary high particularly almost without changing the phase transition temperature $T_{OT}$. The reason is that, when the Sb substitution amount exceeds $0.01 \leq w \leq 0.05$, hetero-phase of LiSbO₃ generates inside the sintered body, which tends to increase the phase transition temperature $T_{OT}$.

Moreover, K, Li and Ta amounts are set to $0.3 \leq x \leq 0.7$, $0.02 \leq y \leq 0.1$ and $0 \leq z \leq 0.5$, respectively. This is because the piezoelectric/electrostrictive porcelain composition suitable for the actuator can be obtained in these ranges. For example, when x is below this range, piezoelectric/electrostrictive properties rapidly deteriorate. On the other hand, when x exceeds this range, it becomes difficult to perform the sintering, and the firing temperature has to be raised. It is not preferable to raise the firing temperature, because when the firing temperature is raised, the alkali components contained in the piezoelectric/electrostrictive porcelain composition evaporate, and the piezoelectric/electrostrictive properties cannot stably be obtained. Moreover, when y is below this range, it also becomes difficult to perform the sintering, and the firing temperature has to be raised. On the other hand, the amount of the hetero-phase increases, while an insulating characteristics is deteriorated, when y exceeds this range.

Furthermore, when z is below this range, the piezoelectric/electrostrictive properties deteriorate. On the other hand, when z exceeds this range, it also becomes difficult to perform the sintering, and the firing temperature has to be raised. (Incidentally, the ranges of the components in the above compositional formula are described in Japanese Patent Application 2007-259706.)

Further, the (Li, Na, K) (Nb, Ta, Sb)O₃ based piezoelectric material of the present invention preferably contains at least one kind of metal element selected from the group consisting of Mn, Cr, Fe, Co, Ni, Cu, and Zn. These elements are transition metal elements or typical metal elements, belong to the groups 6 to 12 of the fourth period similar in chemical properties, and, when the elements are solved into a grain boundary phase of the piezoelectric material, the melting point of the grain boundary phase lowers and coarse grains grow. The above-mentioned elements can be contained in grains, grain boundaries, or hetero-phases as oxides. It is preferable that the metal elements being accessory ingredients are contained in a manner that content thereof is 3 mol % or less with respect to 100 mol % of perovskite oxide in terms of metal atoms. The reason why the content is set to 3 mol % or less is that, if the content exceeds this range, there is a tendency that the dielectric loss increases, and electric-field-induced strain under application of a high electric field tends to decrease.

Next, the manufacturing method of a (Li, Na, K) (Nb, Ta, Sb) O₃ based piezoelectric material of the present invention will be explained. First, raw material powder is synthesized. Chemical compounds containing each of metal elements are weighted so that ratio (mol ratio) of each of the metal elements in the composition of the raw material powder can be fulfilled. The chemical compounds are then mixed with solvent such as ethanol by a mix method such as ball milling to obtain mixture of slurry. Here, types of chemical compounds containing each of the metal elements are not especially limited. Oxides of each metal element or carbonates are preferably used, and, for example, lithium carbonate, potassium tartrate, sodium tartrate, niobium oxide, tantalum oxide and antimony trioxide can be used.

The mixture of slurry is dried by use of a drier or by operation such as percolation. The mixture is calcined, and then crushed. Crushing can be carried out by the method of ball milling or the like. Thus, a raw material powder (calcined/crushed powder) is manufactured.

It is preferable that an average grain diameter of the raw material powder which is calcined/crushed powder is between 0.1 and 1 μm. Here, the average grain diameter is 50% diameter (median size) in cumulative distribution.

It is preferred that an additive mainly containing at least one kind of metal element selected from the group consisting of Mn, Cr, Fe, Co, Ni, Cu and Zn is added to the (Li, Na, K)(Nb, Ta, Sb)O₃ calcined/crushed powder. The powder is formed into pellets, and then the pellets are sintered. Sintering is carried out in a following manner: A constant temperature keeping process wherein a temperature is kept constantly at a predetermined temperature within the range from 800 to 950° C. for a predetermined period of time is carried out in a heating process, and then temperature is raised to firing temperature. It is preferable that the predetermined period of time is within the range from 0.5 to 20 hours in the constant temperature keeping process. Especially, it is more preferable that the predetermined temperature is within the range from 850 to 900° C. The sintering can be carried out in the air condition and an oxygen atmosphere. And the same effect can be obtained in the sintering by hot-pressing (HP).

Then, the sintered body is machined into an appropriate shape (e.g., strip shape), depending on the necessity, polarized, and used as piezoelectric materials. Polarization process is carried out by applying voltage of about 5 kV/mm to the piezoelectric materials for 15 minutes or more.

As mentioned above, manufacturing a sintered body containing microscopic grains having a grain diameter of less than 5 μm, intermediate grains having a grain diameter of 5 μm or more and less than 15 μm, and coarse grains having a grain diameter of 15 μm or more and 50 μm or less, where the amount of the coarse grains is 3% or more in a share in terms of area, enables to improve electrical properties (electric-field-induced strain, relative dielectric constant, piezoelectric constant, dielectric loss, and the like). In order to obtain the sintered bodies, it is preferable that an additive such as $MnO_2$ is added to the calcined/crushed powder for forming (Li, Na, K) (Nb, Ta, Sb)O₃ based piezoelectric materials. Moreover, it is preferable that the constant temperature keeping process wherein temperature is kept constantly at a predetermined temperature for a predetermined period of time is inserted in the heating process from room temperature to firing temperature in the sintering schedule. As a result, sintered bodies having the above-mentioned microscopic structure are obtained, and electrical properties can be improved. It is assumed that electrical properties are improved because internal stress is applied to the sintered bodies.

EXAMPLES

Hereinafter, the present invention will be explained in more detail on the basis of Examples. However, the present invention is not limited thereto.

Comparative Example 1

Figure 2:
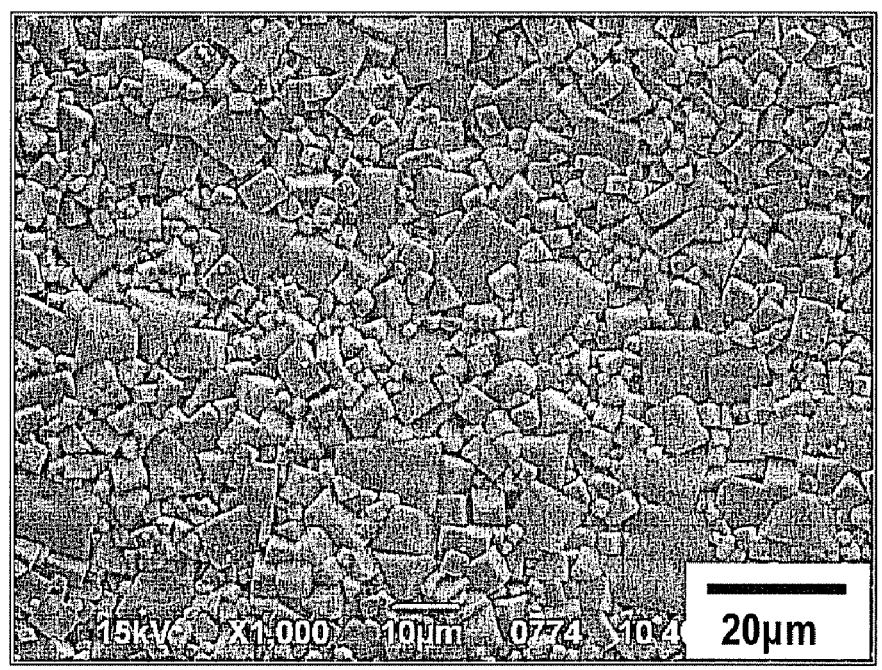
FIG. 2 is an SEM photograph showing surface microstructure of Comparative Example 1.

A calcined/crushed powder (particle diameters of 0.2 to 0.5 μm, a particle shape was spherical) constituted of a composition of $\{Li_y(Na_{1-x}K_x)_{1-y}\}_a(Nb_{1-z-w}Ta_zSb_w)O_3$ (x=0.450, y=0.060, z=0.082, a=1.01, w=0.040)+0.02 mol % $MnO_2$ was formed into pellets (pellet-like sample). The pellet-like sample was heated in a furnace at a heating rate of 200° C./h to a firing temperature of 1000° C. in the air. After retaining at 1000° C. for 3 hours, the sample was cooled in the furnace. An X-ray diffraction profile was measured and c/a which is ratio of c axis to a axis (tetragonality) was calculated using diffraction angles which were middle points of full width at half maximum of diffraction line profiles. Surface microstructure of the sintered body was observed by a scanning electron microscope (SEM). Bulk density was measured by Archimedean method. From the surface microstructure of the sintered body (refer to SEM photograph in FIG. 2), grain size distribution by the diameter corresponding to the diameter of a circle having an area equal to the area of grain was analyzed, taking the vertical axis as the standard for calculating a share of grains in terms of the area. After machining this sintered body into strips, the strips were polarized in silicon oil under the condition of 5 kV/mm×15 min. (at room temperature). And then, electrical properties (relative dielectric constant ∈, piezoelectric constant $d_{31}$, dielectric loss tan δ, electric-field-induced strain S4000, temperature $T_{OT}$ where dielectric constant becomes maximum when heated, etc) were evaluated. The term "S4000" is the amount of strain in 31 direction; that is, direction vertical to an electric field applying direction at a time when an electric field of 4 kV/mm was applied. The results are shown in Tables 1 and 2.

Example 1

After the pellet-like sample described in the Comparative Example 1 was heated in the furnace at a heating rate of 200°

C./h to 800° C. in the air, and kept at 800° C. for 3 hours, then the temperature was raised at a heating rate of 200° C./h to a firing temperature of 1000° C. After retaining the temperature at 1000° C. for 3 hours, the sample was cooled in the furnace. The properties and the crystal structure were evaluated in the same manner as in the Comparative Example 1. The results are shown in Table 1.

Example 2

After the pellet-like sample described in the Comparative Example 1 was heated in the furnace at a heating rate of 200° C./h to 850° C. in the air, and kept at 850° C. for 3 hours, then the temperature was raised at a heating rate of 200° C./h to a firing temperature of 1000° C. After retaining the temperature at 1000° C. for 3 hours, the sample was cooled in the furnace. The properties and the crystal structure were evaluated in the same manner as in the Comparative Example 1. The results are shown in Table 1.

Example 3

After the pellet-like sample described in the Comparative Example 1 was heated in the furnace at a heating rate of 200° C./h to 880° C. in the air, and kept at 880° C. for 3 hours, then the temperature was raised at a heating rate of 200° C./h to a firing temperature of 1000° C. After retaining the temperature at 1000° C. for 3 hours, the sample was cooled in the furnace. The properties and the crystal structure were evaluated in the same manner as in the Comparative Example 1. The results are shown in Table 1, Table 2 and Table 3. The surface microstructure of the sintered body is shown in FIG. 1.

Example 4

After the pellet-like sample described in the Comparative Example 1 was heated in the furnace at a heating rate of 200° C./h to 900° C. in the air, and kept at 900° C. for 3 hours, then the temperature was raised at a heating rate of 200° C./h to a firing temperature of 1000° C. After retaining the temperature at 1000° C. for 3 hours, the sample was cooled in the furnace. The properties and the crystal structure were evaluated in the same manner as in the Comparative Example 1. The results are shown in Table 1.

Example 5

After the pellet-like sample described in the Comparative Example 1 was heated in the furnace at a heating rate of 200° C./h to 950° C. in the air, and kept at 950° C. for 3 hours, then the temperature was raised at a heating rate of 200° C./h to a firing temperature of 1000° C. After retaining the temperature at 1000° C. for 3 hours, the sample was cooled in the furnace. The properties and the crystal structure were evaluated in the same manner as in the Comparative Example 1. The results are shown in Table 1.

Comparative Example 2

After the pellet-like sample described in the Comparative Example 1 was heated in the furnace at a heating rate of 200° C./h to 960° C. in the air, and kept at 960° C. for 3 hours, then the temperature was raised at a heating rate of 200° C./h to a firing temperature of 1000° C. After retaining the temperature at 1000° C. for 3 hours, the sample was cooled in the furnace. The properties and the crystal structure were evaluated in the same manner as in the Comparative Example 1. The results are shown in Table 1.

Example 6

After the pellet-like sample described in the Comparative Example 1 was heated in the furnace at a heating rate of 200° C./h to 880° C. in the air, and kept at 880° C. for 0.5 hours, then the temperature was raised at a heating rate of 200° C./h to a firing temperature of 1000° C. After retaining the temperature at 1000° C. for 3 hours, the sample was cooled in the furnace. The properties and the crystal structure were evaluated in the same manner as in the Comparative Example 1. The results are shown in Table 2.

Example 7

After the pellet-like sample described in the Comparative Example 1 was heated in the furnace at a heating rate of 200° C./h to 880° C. in the air, and kept at 880° C. for 6 hours, then the temperature was raised at a heating rate of 200° C./h to a firing temperature of 1000° C. After retaining the temperature at 1000° C. for 3 hours, the sample was cooled in the furnace. The properties and the crystal structure were evaluated in the same manner as in the Comparative Example 1. The results are shown in Table 2.

Example 8

After the pellet-like sample described in the Comparative Example 1 was heated in the furnace at a heating rate of 200° C./h to 880° C. in the air, and kept at 880° C. for 13 hours, then the temperature was raised at a heating rate of 200° C./h to a firing temperature of 1000° C. After retaining the temperature at 1000° C. for 3 hours, the sample was cooled in the furnace. The properties and the crystal structure were evaluated in the same manner as in the Comparative Example 1. The results are shown in Table 2.

Example 9

After the pellet-like sample described in the Comparative Example 1 was heated in the furnace at a heating rate of 200° C./h to 880° C. in the air, and kept at 880° C. for 20 hours, then the temperature was raised at a heating rate of 200° C./h to a firing temperature of 1000° C. After retaining the temperature at 1000° C. for 3 hours, the sample was cooled in the furnace. The properties and the crystal structure were evaluated in the same manner as in the Comparative Example 1. The results are shown in Table 2.

Example 10

After machining the sintered body manufactured in the Example 3 into strips, the strips were polarized in silicon oil under the condition of 5 kV/mm×15 min (80° C.). And then, electrical properties were evaluated. The results are shown in Table 3.

TABLE 1

|  | Comp. Ex. 1 | Ex. 1 | Ex. 2 | Ex. 3 | Ex. 4 | Ex. 5 | Comp. Ex. 2 |
|---|---|---|---|---|---|---|---|
| Keeping temperature (° C.) | Not kept | 800 | 850 | 880 | 900 | 950 | 960 |
| Bulk density (g/cm$^3$) | 4.451 | 4.430 | 4.456 | 4.470 | 4.443 | 4.425 | 4.360 |
| Relative dielectric constant | 1045 | 1123 | 1196 | 1172 | 1170 | 1120 | 1033 |
| d31 (pm/V) | 88 | 89 | 93 | 93 | 92 | 88 | 71 |
| tan δ (%) | 1.6 | 1.7 | 1.5 | 1.4 | 1.4 | 1.8 | 8.6 |
| S4000 (ppm) | 537 | 584 | 604 | 621 | 596 | 575 | 482 |
| c/a | 1.015 | 1.0152 | 1.0152 | 1.0153 | 1.0153 | 1.0153 | 1.0153 |
| $T_{oT}$ (° C.) | 43 | 44 | 44 | 44 | 44 | 44 | 43 |
| Grain size distribution — Microscopic grain | 48% | 48% | 40% | 38% | 40% | 48% | 48% |
| Intermediate grain | 50% | 49% | 48% | 47% | 48% | 49% | 50% |
| Coarse grain | 2% | 3% | 12% | 15% | 12% | 3% | 2% |

Table 1 shows dependency on keeping temperature, and keeping time was 3 hours. These properties were evaluated at room temperature, and relative dielectric constants and piezoelectric constants are values after polarization, and grain diameter of the microscopic grain was less than 5 μm, that of the intermediate grain was 5 μm or more and less than 15 μm, and that of the coarse grain was 15 μm or more and 50 μm or less. Ratio of the grain size was calculated by, taking the vertical axis as the standard for calculating a share of grains in terms of the area.

TABLE 2

|  | Comp. Ex. 1 | Ex. 6 | Ex. 3 | Ex. 7 | Ex. 8 | Ex. 9 |
|---|---|---|---|---|---|---|
| Keeping temperature (° C.) | Not kept | 0.5 | 3 | 6 | 13 | 20 |
| Bulk density (g/cm$^3$) | 4.451 | 4.461 | 4.470 | 4.446 | 4.440 | 4.429 |
| Relative dielectric Constant | 1045 | 1109 | 1172 | 1149 | 1170 | 1082 |
| d31 (pm/V) | 88 | 91 | 93 | 91 | 90 | 90 |
| tan δ (%) | 1.6 | 1.6 | 1.4 | 2.0 | 1.6 | 1.8 |
| S4000 (ppm) | 537 | 579 | 621 | 594 | 602 | 577 |
| c/a | 1.0150 | 1.0152 | 1.0153 | 1.0152 | 1.0155 | 1.0152 |
| $T_{oT}$ (° C.) | 43 | 44 | 44 | 44 | 43 | 44 |
| Grain size distribution — Microscopic grain | 48% | 48% | 38% | 40% | 39% | 40% |
| Intermediate grain | 50% | 49% | 47% | 48% | 48% | 49% |
| Coarse grain | 2% | 3% | 15% | 12% | 13% | 11% |

Table 2 shows dependency on keeping time, and keeping temperature was 880° C. As in Table 1, these properties were evaluated at room temperature, and relative dielectric constants and piezoelectric constants are values after polarization, and grain diameter of the microscopic grain was less than 5 μm, that of the intermediate grain was 5 μm or more and less than 15 μm, and that of the coarse grain was 15 μm or more and 50 μm or less. The ratio of the grain size was calculated by, taking the vertical axis as the standard for calculating a share of grains in terms of the area.

TABLE 3

|  | Ex. 3 | Ex. 10 |
|---|---|---|
| Polarization temperature (° C.) | 25 | 80 |
| Relative dielectric constant | 1172 | 1260 |
| d31 (pm/V) | 93 | 92 |
| tan δ (%) | 1.4 | 1.5 |
| S4000 (ppm) | 621 | 670 |

Table 3 shows dependency on polarization temperature, and the keeping temperature and the keeping time were 880° C. and 3 h, respectively. The properties were evaluated at room temperature, and relative dielectric constant and piezoelectric constant are values after polarization.

As is clear from the above results, the insertion of the constant temperature keeping process between 800 to 950° C. (preferably, a 850 to 900° C.) in the heating process of the sintering schedule enables to obtain sintered bodies where the ratio of microscopic grains having a grain diameter of less than 5 μm is decreased and where the ratio of the coarse grains having a grain diameter of 15 μm or more and 50 μm or less is increased and to improve electrical properties such as the electric-field-induced strain S4000. There were improvements in properties in the cases of 0.5 hour or more of keeping time, and there were slight reductions in properties in the case of 20 hours; however, there were sufficient improvements in properties. Under the keeping conditions under which there was improvement in electrical properties, the ratio of microscopic grains decreased, the ratio of coarse grains increased, and c/a (extent of tetragonality) became larger. However, when each sintered body was crushed and X-ray diffraction profile of the crushed powder is measured, the c/a of crushed powder is lowered regardless of the original microstructure of sintered body, and all the samples show similar values. Accordingly, internal stress was induced in the sintered bodies of Examples 1 to 9; thereby, the tetragonal system became a nearly stable crystalline phase at or around room temperature, c/a became larger, and there were improvements in electrical properties such as electric-field-induced strain.

The mechanism in which microscopic grains decrease and coarse grains increase in the constant temperature keeping process, is as follows. The constant temperature keeping process in the range from 800 to 950° C. expands intergranular phases thinly and equally. Therefore, grain growth is suppressed; that is, energy for grain growth is accumulated. If a metal element such as Mn is taken in the intergranular phase, the melting point of the intergranular phase is lowered, and the intergranular phase is molten at firing temperature. At this time, accumulated energy for grain growth is released at once, and coarse grains grow. Grains on surfaces and in the vicinity of pores, which are not spacially continued, are not easily taken by the coarse grains and therefore become microscopic and intermediate grains.

Manufacturing sintered bodies containing microscopic grains having a grain diameter of less than 5 μm, intermediate grains having a grain diameter of 5 μm or more and less than 15 μm, and coarse grains having a grain diameter of 15 μm or more and 50 μm or less, where the amount of the coarse grains is 3% or more in a share in terms of area, enables to obtain high electrical properties (relative dielectric constant, piezoelectric constant, dielectric loss, electric-field-induced strain, and the like). It is assumed that this is because of the effect of internal stress. As methods to obtain such microstructures, it is effective that (1) an additive which mainly contains Mn, Cr, Fe, Co, Ni, Cu, or Zn is added to the calcined/crushed powder having a composition expressed by (Li, Na, K) (Nb, Ta, Sb) $O_3$, and (2) a constant temperature keeping process between 800 and 950° C. is inserted to the sintering schedule. According to the present method, S4000 which was 537 ppm could be improved up to 621 ppm. Further, by applying a high-temperature polarization treatment, S4000 could be improved up to 670 ppm. Incidentally, in the above Examples, sintering was carried out under the atmospheric condition; however, it was confirmed that the same effect could be obtained in the sintering in an oxygen atmosphere or in the sintering by hot-pressing.

INDUSTRIAL APPLICABILITY

The piezoelectric materials of the present invention show superior electric-field-induced strain and are suitable as piezoelectric devices for actuators, sensors, or the like.

What is claimed is:

1. A (Li, Na, K)(Nb, Ta, Sb)$O_3$ based piezoelectric material, wherein a sintered body of said (Li, Na, K)(Nb, Ta, Sb)$O_3$ based piezoelectric/electrostrictive material includes Sb, and has a surface microstructure of microscopic grains having a grain diameter of less than 5 μm, intermediate grains having a grain diameter of 5 μm or more and less than 15 μm, and coarse grains having a grain diameter of 15 μm or more and 50 μm or less, wherein an amount of the coarse grains is 3% or more in a share of grains in terms of area.

2. The (Li, Na, K)(Nb, Ta, Sb)$O_3$ based piezoelectric material according to claim 1, wherein an amount of the microscopic grains is 30% to 60% in a share in terms of area.

3. The (Li, Na, K)(Nb, Ta, Sb)$O_3$ based piezoelectric material according to claim 1, expressed by a composition formula: $\{Li_y(Na_{1-x}K_x)_{1-y}\}_a(Nb_{1-z-w}Ta_zSb_w)O_3$ (here, $1 \leq a \leq 1.05$, $0.3 \leq x \leq 0.7$, $0.02 \leq y \leq 0.1$, $0 \leq z \leq 0.5$, and $0.01 \leq w \leq 0.1$).

4. The (Li, Na, K)(Nb, Ta, Sb)$O_3$ based piezoelectric material according to claim 2, expressed by a composition formula: $\{Li_y(Na_{1-x}K_x)_{1-y}\}_a(Nb_{1-z-w}Ta_zSb_w)O_3$ (here, $1 \leq a \leq 1.05$, $0.3 \leq x \leq 0.7$, $0.02 \leq y \leq 0.1$, $0 \leq z \leq 0.5$, and $0.01 \leq w \leq 0.1$).

5. The (Li, Na, K)(Nb, Ta, Sb)$O_3$ based piezoelectric material according to claim 1, which contains further at least one kind of metal element selected from the group consisting of Mn, Cr, Fe, Co, Ni, Cu and Zn.

6. The (Li, Na, K)(Nb, Ta, Sb)$O_3$ based piezoelectric material according to claim 2, which contains further at least one kind of metal element selected from the group consisting of Mn, Cr, Fe, Co, Ni, Cu and Zn.

7. The (Li, Na, K)(Nb, Ta, Sb)$O_3$ based piezoelectric material according to claim 3, which contains further at least one kind of metal element selected from the group consisting of Mn, Cr, Fe, Co, Ni, Cu and Zn.

8. A manufacturing method of a (Li, Na, K) (Nb, Ta, Sb)$O_3$ based piezoelectric material including Sb, wherein chemical compounds having metal elements are mixed so as to have a composition expressed by (Li, Na, K) (Nb, Ta, Sb) $O_3$, including Sb, the mixture is calcined and crushed to obtain a calcined/crushed powder, then, in a constant temperature keeping process, a temperature is kept constantly at a temperature within a range from 800 to 950° C. for a predetermined period of time in a heating process of a sintering schedule, and then temperature is raised to firing temperature for sintering.

9. The manufacturing method of a (Li, Na, K) (Nb, Ta, Sb) $O_3$ based piezoelectric material according to claim 8, wherein in the constant temperature keeping process the temperature is kept for a period of time within a range from 0.5 to 20 hours.

10. The manufacturing method of a (Li, Na, K) (Nb, Ta, Sb) $O_3$ based piezoelectric material according to claim 8, wherein the calcined/crushed powder is sintered after an additive mainly containing at least one metal element selected from the group consisting of Mn, Cr, Fe, Co, Ni, Cu, and Zn is added to the powder.

11. The manufacturing method of a (Li, Na, K) (Nb, Ta, Sb) $O_3$ based piezoelectric material according to claim 9, wherein the calcined/crushed powder is sintered after an additive mainly containing at least one metal element selected from the group consisting of Mn, Cr, Fe, Co, Ni, Cu, and Zn is added to the powder.

* * * * *